(12) United States Patent
North et al.

(10) Patent No.: US 12,038,795 B2
(45) Date of Patent: Jul. 16, 2024

(54) INFORMATION HANDLING SYSTEM VISUAL PRESENTATION WITH AUDIO VECTOR BASED INFORMATION

(71) Applicant: Dell Products L.P., Round Rock, TX (US)

(72) Inventors: Travis C. North, Cedar Park, TX (US); Jace W. Files, Round Rock, TX (US); Yongook Guack, Austin, TX (US); John Trevor Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 756 days.

(21) Appl. No.: 17/119,594

(22) Filed: Dec. 11, 2020

(65) Prior Publication Data

US 2022/0187883 A1   Jun. 16, 2022

(51) Int. Cl.
*A63F 13/00* (2014.01)
*A63F 13/53* (2014.01)
(Continued)

(52) U.S. Cl.
CPC ............ *G06F 1/203* (2013.01); *A63F 13/537* (2014.09); *G05B 19/4155* (2013.01); *G06F 1/1616* (2013.01); *G06F 1/1673* (2013.01); *G06F 3/04886* (2013.01); *G06F 3/14* (2013.01); *G06T 1/20* (2013.01); *G10L 25/51* (2013.01);
(Continued)

(58) Field of Classification Search
CPC .......... G06F 13/14; A63F 13/00; A63F 13/53; A63F 13/537; G10L 21/10
See application file for complete search history.

(56) References Cited

U.S. PATENT DOCUMENTS 6,023,402 A   2/2000   Kaminski
6,195,255 B1  2/2001   Kim
(Continued)

FOREIGN PATENT DOCUMENTS

AU   2008264803 A1   12/2008
EP      2364005 B1    9/2011
(Continued)

OTHER PUBLICATIONS

Stephenson J, A UX Analysis of First-Person Shooter Damage Indicators, Mar. 3, 2018, https://medium.com/@jasper.stephenson/a-ux-analysis-of-first-person-shooter-damage-indicators-59ac9d41caf8 (Year: 2018).*

*Primary Examiner* — Mark A Connolly
(74) *Attorney, Agent, or Firm* — ZAGORIN CAVE LLP; Robert W. Holland

(57) ABSTRACT

A portable information handling system executes an application, such as a game, that generates audio information for presentation at multiple speakers through multiple channels. An audio vector engine analyzes the channels to derive a direction and distance associated with the audio information so that a visual cue of the relative location of the origin of the audio information may be presented at a display. In one embodiment, the display is a secondary display having a transparent view into the information handling system. In another embodiment, the direction and distance to a sound origin is presented over a map of a game in which the sound originated, such as a shot fired in a game.

14 Claims, 16 Drawing Sheets

(51) Int. Cl.
*A63F 13/537* (2014.01)
*G05B 19/4155* (2006.01)
*G06F 1/16* (2006.01)
*G06F 1/20* (2006.01)
*G06F 3/04886* (2022.01)
*G06F 3/14* (2006.01)
*G06F 13/14* (2006.01)
*G06T 1/20* (2006.01)
*G10L 21/10* (2013.01)
*G10L 25/51* (2013.01)
*G11B 33/02* (2006.01)
*G11B 33/14* (2006.01)
*H04R 1/02* (2006.01)
*H04R 5/02* (2006.01)
*H04S 3/00* (2006.01)
*H05K 7/20* (2006.01)

(52) U.S. Cl.
CPC .......... *G11B 33/025* (2013.01); *G11B 33/142* (2013.01); *H04R 1/028* (2013.01); *H04R 5/02* (2013.01); *H04S 3/008* (2013.01); *H05K 7/20136* (2013.01); *H05K 7/20209* (2013.01); *G05B 2219/49216* (2013.01); *H04R 2499/11* (2013.01); *H04R 2499/15* (2013.01); *H04S 2400/01* (2013.01)

(56) References Cited

U.S. PATENT DOCUMENTS

| | | |
|---|---|---|
| 6,415,612 B1 | 7/2002 | Pokharna et al. |
| 6,631,755 B1 | 10/2003 | Kung et al. |
| 6,695,041 B2 | 2/2004 | Lai |
| 6,924,978 B2 | 8/2005 | Distefano |
| 7,151,837 B2 | 12/2006 | Bank et al. |
| 7,350,011 B2 | 3/2008 | Keely et al. |
| 8,063,887 B2 | 11/2011 | Barrus et al. |
| 8,166,412 B2 | 4/2012 | Jain et al. |
| 8,644,550 B2 | 2/2014 | Basson et al. |
| 8,667,473 B2 | 3/2014 | Goossen et al. |
| 8,996,331 B2 | 3/2015 | Anderson et al. |
| 9,148,979 B2 | 9/2015 | Chiriac et al. |
| 9,155,405 B2 | 10/2015 | Artwohl et al. |
| 9,195,829 B1 | 11/2015 | Goradia et al. |
| 9,477,317 B1 | 10/2016 | Clements |
| 9,639,126 B2 | 5/2017 | Senyk et al. |
| 9,671,171 B2 | 6/2017 | Xiang |
| 9,965,035 B2 | 5/2018 | Santamaria et al. |
| 10,120,418 B2 | 11/2018 | Lee et al. |
| 10,401,926 B1 | 9/2019 | North |
| 10,409,552 B1* | 9/2019 | Jara .................. G10L 15/22 |
| 10,417,943 B2 | 9/2019 | Dunn |
| 10,551,888 B1 | 2/2020 | North |
| 10,564,677 B2 | 2/2020 | Lee |
| 10,579,112 B2 | 3/2020 | North |
| 10,579,113 B2 | 3/2020 | North |
| 10,802,555 B2 | 10/2020 | North |
| 10,802,556 B2 | 10/2020 | North |
| 10,936,031 B2 | 3/2021 | North |
| 10,969,841 B2 | 4/2021 | North |
| 11,175,504 B2 | 11/2021 | Tiana et al. |
| 2002/0190068 A1 | 12/2002 | Sisk et al. |
| 2004/0246428 A1 | 12/2004 | Shirato |
| 2005/0103477 A1 | 5/2005 | Kim et al. |
| 2005/0286214 A1 | 12/2005 | Chen |
| 2006/0078423 A1 | 4/2006 | Zheng |
| 2008/0130221 A1 | 6/2008 | Varadarajan et al. |
| 2009/0167691 A1 | 7/2009 | Wang et al. |
| 2009/0278006 A1 | 11/2009 | Park et al. |
| 2010/0214743 A1 | 8/2010 | Huang et al. |
| 2012/0204970 A1 | 8/2012 | Chaffee |
| 2013/0107425 A1 | 5/2013 | Wright et al. |
| 2013/0300978 A1 | 11/2013 | Yang et al. |
| 2013/0328792 A1 | 12/2013 | Meyers et al. |
| 2015/0199955 A1 | 7/2015 | Draganic |
| 2015/0347902 A1* | 12/2015 | Butler, Jr. ........ G08B 13/19645 706/46 |
| 2016/0070309 A1 | 3/2016 | Yang et al. |
| 2016/0316301 A1 | 10/2016 | Chen |
| 2017/0083280 A1* | 3/2017 | Yu ..................... G10L 21/14 |
| 2017/0097689 A1 | 4/2017 | Miller |
| 2017/0303048 A1 | 10/2017 | Hooton et al. |
| 2017/0366898 A1 | 12/2017 | Melanson et al. |
| 2018/0101197 A1 | 4/2018 | Barnett et al. |
| 2018/0101711 A1 | 4/2018 | D'Souza et al. |
| 2018/0180414 A1 | 6/2018 | Schubert et al. |
| 2018/0196471 A1 | 7/2018 | Soken |
| 2018/0279028 A1 | 9/2018 | Mittleman et al. |
| 2019/0027808 A1 | 1/2019 | Mow et al. |
| 2019/0141434 A1 | 5/2019 | Fukuma |
| 2019/0189042 A1 | 6/2019 | Aurongzeb et al. |
| 2019/0204175 A1 | 7/2019 | Cegnar et al. |
| 2019/0268550 A1* | 8/2019 | Arnold .................. A42B 3/042 |
| 2019/0320267 A1 | 10/2019 | Chiu et al. |
| 2019/0324574 A1 | 10/2019 | Schooley et al. |
| 2019/0342442 A1 | 11/2019 | Coverstone |
| 2021/0204441 A1 | 7/2021 | Huang et al. |
| 2021/0218135 A1 | 7/2021 | Ramasamy et al. |
| 2021/0397140 A1 | 12/2021 | Crowley et al. |
| 2022/0050479 A1* | 2/2022 | Hurst .................... G05D 1/104 |

FOREIGN PATENT DOCUMENTS

| | | |
|---|---|---|
| KR | 20070100611 A | 10/2007 |
| KR | 101523602 B1 | 5/2015 |
| TW | 200811786 A | 3/2008 |

\* cited by examiner

INFORMATION HANDLING SYSTEM VISUAL PRESENTATION WITH AUDIO VECTOR BASED INFORMATION

BACKGROUND OF THE INVENTION

Field of the Invention

The present invention relates in general to the field of portable information handling systems, and more particularly to an information handling system visual presentation with audio vector based information.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Convertible portable information handling system configurations typically include multiple separate housing portions that rotationally couple to each other so that the system converts between closed and open positions. For example, a main housing portion integrates processing components and a keyboard and rotationally couples with hinges to a lid housing portion that integrates a display. In a clamshell position, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Although an integrated keyboard provides a convenient input device for a mobile end user, in some types of portable systems end user interactions are often supported through peripheral devices, such as wireless input devices and peripheral displays. For instance, many end users who play gaming applications desire powerful systems with good graphics but in a portable housing so that the end user can play games while mobile. Many gamers also desire portable systems that are upgradeable so that the user can configure the system with specialized components. With portable systems, flexibility in configurations can present a problem since the systems are designed to fit in a portable housing having a smaller internal size. Often end users have to unscrew and disassemble housing portions at the bottom of the system to access components for servicing. Further, portable systems tend to be sensitive to thermal constraints since the internal housing tends to have more restricted airflow. Thus, end users who specially configure their systems may have undesirable side effects related to the interaction of the internal components. This can create problems for the end user who is distracted by monitoring of operating conditions while trying to interact with a gaming application.

Another problem that can arise with portable information handling systems is the integration of effective speakers in a housing. A reduce footprint in a portable system can reduce the effectiveness of speakers both in size and in location. To achieve a stereo sound effect, speakers associated with different channels of audio should have physical spacing between each other. One type of speaker that has a reduced size with effective output is a piezoelectric speaker. However, these speakers need a sealed chamber and proximity to an outer surface to efficiently generate sound. Even with the improved capability of these speakers, the small form factor of the portable housing limits spacing between the integrated speakers so that stereo effects can have reduced impact.

SUMMARY OF THE INVENTION

Therefore, a need has arisen for a system and method which provides improved ease of access to components in a portable information handling system housing.

A further need exists for a system and method which outputs audio from a speaker through a main housing portion transparent cover.

A further need exists for a system and method which analyzes audio information generated by an application to determine positional information related to the application.

In accordance with the present invention, a system and method are provided which substantially reduce the disadvantages and problems associated with previous methods and systems that cover a portable information handling system housing portion in a manner that supports end user access to the housing interior with audio output through the cover and presentation of visual cues that supplement audio presentation. A portable information handling system main housing portion has a transparent cover that rotates between open and closed positions to expose components in the housing. The transparent cover is sealed with an inflatable seal and integrates wirelines and contact pads that carry audible signals to a speaker disposed in a cavity under the transparent cover. The transparent cover integrates a display, such as a liquid crystal display layer, that provides a secondary display function for presenting supplemental information, such as positional information derived from analysis of audio output and a virtual keyboard that moves synchronously with an extendable physical keyboard.

More specifically, a portable information handling system has a portable housing that contains processing components and rotates between open and closed positions. A transparent cover fits over a portion of the housing to protect the components, which are visible through the protective cover. In one example embodiment, the protective cover integrates a display, such as a liquid crystal display layer or an organic light emitting diode film layer, to present supplemental information as visual images. The transparent cover is, for instance, a glass cover biased to an open position by hydraulic arms and held in a closed position with capacitance locks that selectively release in response to a proximate end user touch. An inflatable seal around a portion of the perimeter of the housing portion seals against air entering into the housing from undesired directions when the transparent cover is in the closed position. A piezoelectric speaker is disposed in a speaker cavity under the transparent cover and interfaced with processing components to receive audio signals through wirelines and contact pads integrated in the transparent cover. The speaker cavity is sealed with the transparent cover in a closed position to provide a speaker chamber that efficiently generates audio sounds by the piezoelectric speaker. Audio sounds generated by an application executing on the information handling system, such as a gaming application, is monitored to identify defined sound patterns, such as shots fired, and analyzes the audio information associated with the sounds to determine positional information for presentation to an end user as visual cues, such as a location of a player in a gaming application who fired the shots. The display layer integrated in the transparent cover provides a supplemental viewing surface to present the visual cues and other information, such as a virtual keyboard that slides synchronously with a physical keyboard that extends and retracts from the system.

The present invention provides a number of important technical advantages. One example of an important technical advantage is that a portable information handling system housing is accessible from an upper side by lifting a transparent cover from the housing so that servicing and enhancement of internal components is simpler and readily performed. The transparent cover is sealed with an inflatable seal to provide resistance to undesired airflow at the housing perimeter, such as by having air intake at a rear side of the housing. A display integrated in the transparent cover provides presentation of supplemental information, such as operating conditions of components within the housing, a position of a keyboard that extends from the housing and application specific information. Processing of audio information played by an application to generate audio vector information related to the audio source is presented as visual cues that supplement the application. In a gaming environment, key player positional information may be derived that is otherwise not available to give an end user an edge in the game.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system integrates a removable secondary display that provides improved access to internal components and supplemental visual presentation for operating conditions and applications. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
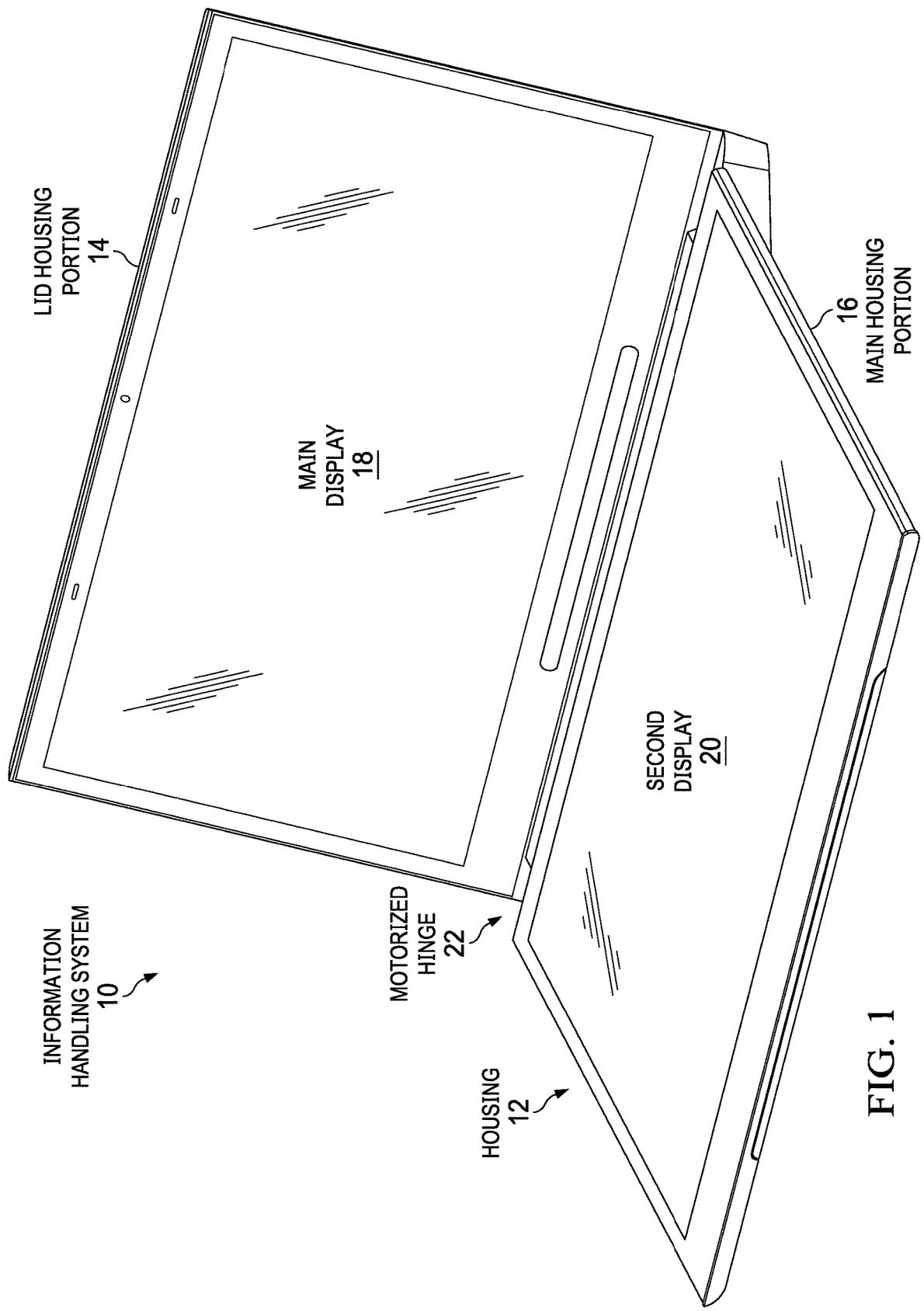
FIG. 1 depicts a front perspective view of a portable information handling system having a main display and a secondary display.

Referring now to FIG. 1, a front perspective view depicts a portable information handling system 10 having a main display 18 and a secondary display 20. In the example embodiment, information handling system 10 is built in a portable housing 12 having a lid housing portion 14 rotationally-coupled to a main housing portion 16 by a motorized hinge 22 that automatically rotates housing 12 between a closed position and the open clamshell position in the depicted example embodiment. In the open clamshell position, main display 18 presents information generated by executing an application as visual images, such as with an organic light emitting diode (OLED) display film or a liquid crystal display (LCD) panel. For example, a gaming application executes on an operating system to generate gaming output for presentation at main display 18. Secondary display 20 has a transparent composition, such as glass, that integrates a display while allowing an end user to see into main housing portion 16. For example, secondary display 20 integrates an OLED film or LCD that does not have a solid background so that the end user can see through secondary display 20, which effectively acts as a transparent cover over main housing portion 16. The use of a transparent cover that integrates a display capability offers various functions including supplementation of visual images presented at main display 18, presentation of operating conditions or other system management interfaces, and improved access by an end user to the interior of main housing portion 16, as described below.

Figure 2:
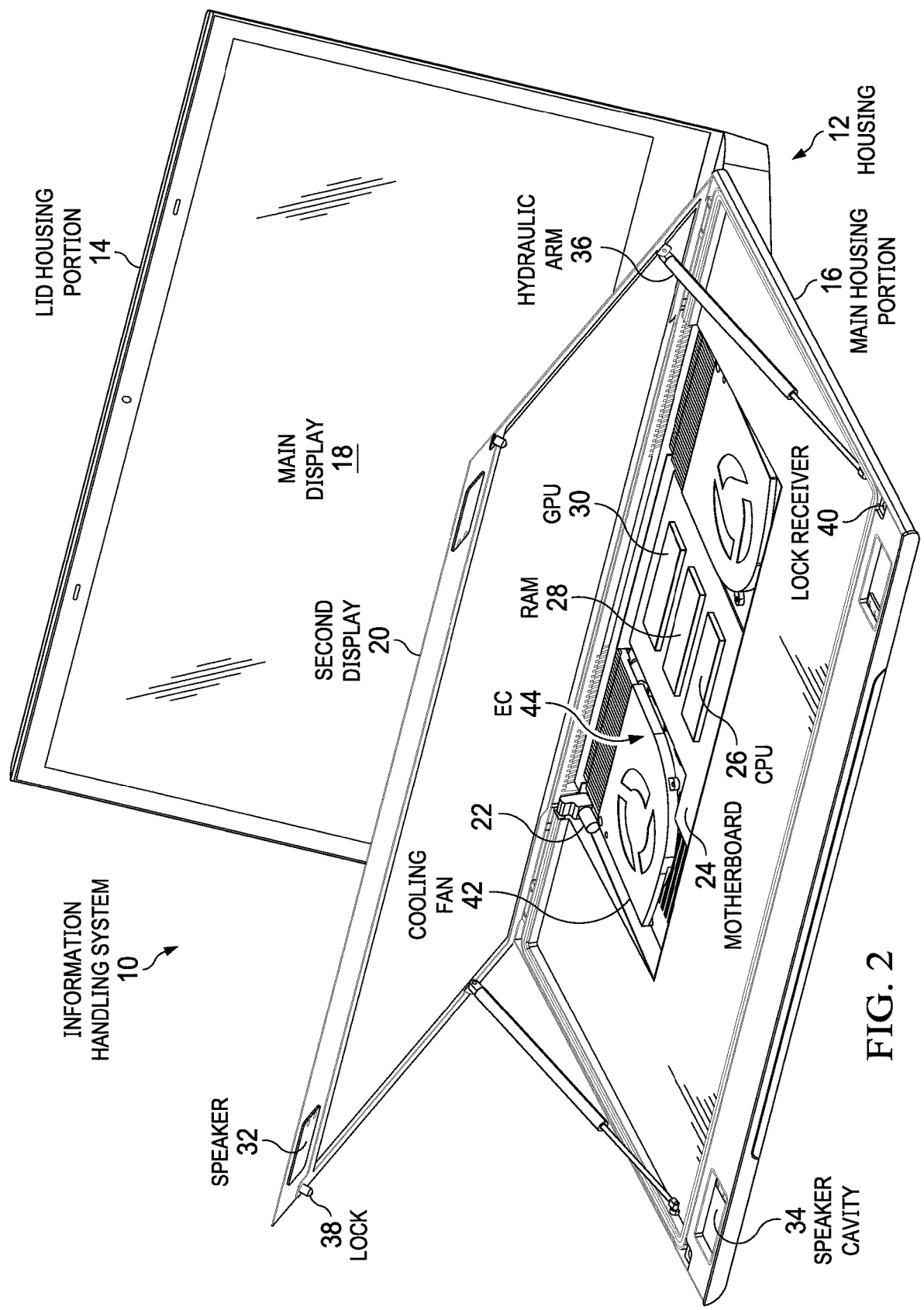
FIG. 2 depicts a front perspective view of a portable information handling system having a secondary display raised above a main housing portion to provide access to underlying processing components.

Referring now to FIG. 2, a front perspective view depicts a portable information handling system 10 having secondary display 20 raised above main housing portion 16 to provide access to underlying processing components. Secondary display 20 rotationally couples at a rear side of main housing portion 16, such as with a motorized hinge 22, to rotate between the closed position of FIG. 1 and the open position depicted by FIG. 2 in which secondary display 20 is raised above main housing portion 16 by hydraulic arms 36. When secondary display 20 is lifted, processing components disposed in main housing portion 16 are exposed so that an end user can access them, such as to make modifications to the processing components. In the example embodiment, a motherboard 24 supports and interfaces the processing components. A central processing unit (CPU) 26 couples to motherboard 24 to process information by executing instructions of an operating system and applications that are stored in a random access memory (RAM) 28. A graphics processor unit (GPU) 30 interfaces with CPU 26 to further process information and define visual images with pixel values for presentation at main display 18. A speaker 32 interfaces with CPU 26 to output audio information as audible sounds. In the example embodiment, speaker 32 is a piezoelectric speaker that fits in a speaker cavity 34 defined in main housing portion 16. Cooling fans 42 couple inside of main housing portion 16 to generate a cooling airflow that rejects excess thermal energy.

Secondary display 20 provides a transparent and removable cover over main housing portion 16 that integrates a display layer to present visual images to an end user generated by GPU 30 or a management controller, such as an embedded controller 44 that manages system operating conditions like power and thermals. To simplify access to the interior of main housing portion 16, a capacitance lock 38 selectively engages a lock receiver 40 to hold secondary display 20 coupled to main housing portion 16. Capacitance lock 38 releases in response to a proximate touch so that an upward bias of hydraulic arm 36 lifts secondary display 20 to the raised position. When pressed downward, secondary display 20 engages capacitance lock 38 into lock receiver 40 to cover the interior of main housing portion 16 until a touch commands release of the lock. Advantageously, access through the top of main housing portion 16 reduces the complexity of performing upgrades and repairs to components in housing 12 and improves system integrity by having a solid base of main housing portion 16 without including an access through the bottom surface to the housing interior.

Figure 3:
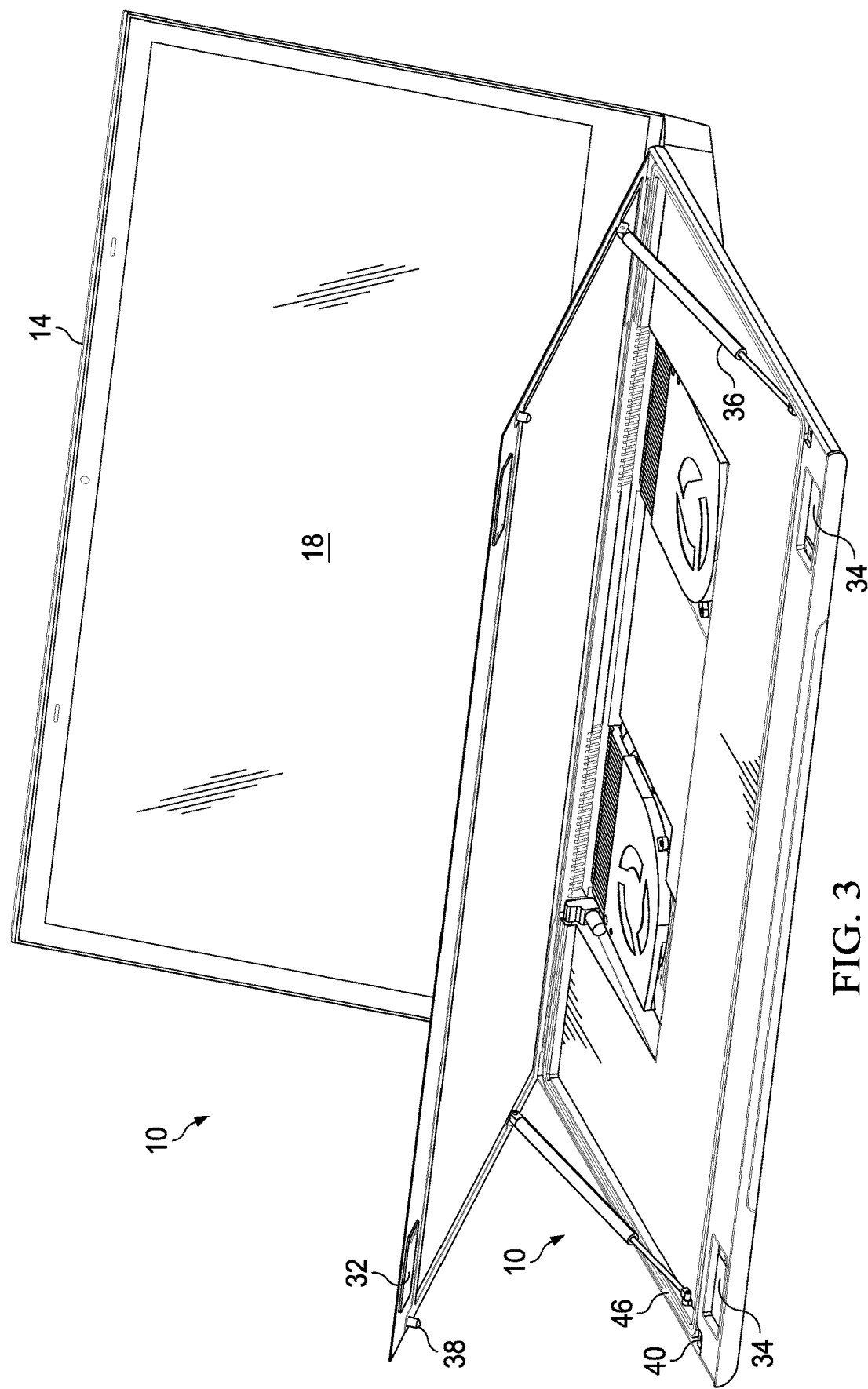
FIG. 3 depicts a front perspective view of an inflatable seal arrangement that seals the secondary display when closed over the main housing portion.

Referring now to FIG. 3, a front perspective view depicts an inflatable seal arrangement that seals secondary display 20 when closed over main housing portion 16. In the example embodiment, inflatable seal 46 proceeds around a portion of the perimeter of main housing portion 16 to prevent air from flowing into the housing interior except where desired, such as through bottom or rear vents of housing 12. In the example embodiment, inflatable seal 46 is offset from the front face of main housing portion 16 to leave a border in which speaker cavities 34 are formed at opposing sides to accept piezoelectric speakers 32. Capacitive locks 38 couple into lock receivers 40 proximate to where inflatable seal 46 bends to cross the front of main housing portion 16 near the coupling location of hydraulic arm 36 so that a strong seal may be maintained. Speakers 32 are shown coupled to a bottom side of secondary display 20 to fit into cavities 34 with power provided through wirelines integrated in secondary display 20 as set forth below. When secondary display 20 captures speakers 32 within cavities 34 of main housing portion 16, the piezoelectric transducer of the speakers generates sounds within the speaker chamber defined by the cavity and secondary display. When the display layer included in the transparent cover of secondary display 20 has an OLED material, presentation of visual images may be generated by illumination of OLED pixels. When the display layer is an LCD, a backlight may be included within speaker cavity 34 that the LCD filters to generate visual images. Similarly backlights may be distributed in main housing portion 16 as needed to present operating conditions or other visual images as described below. In an embodiment where secondary display is just a transparent cover, such as glass, without an integrated display, different color LEDs may be disposed in main housing portion 16 to provide lighting effects as desired.

Figure 4:
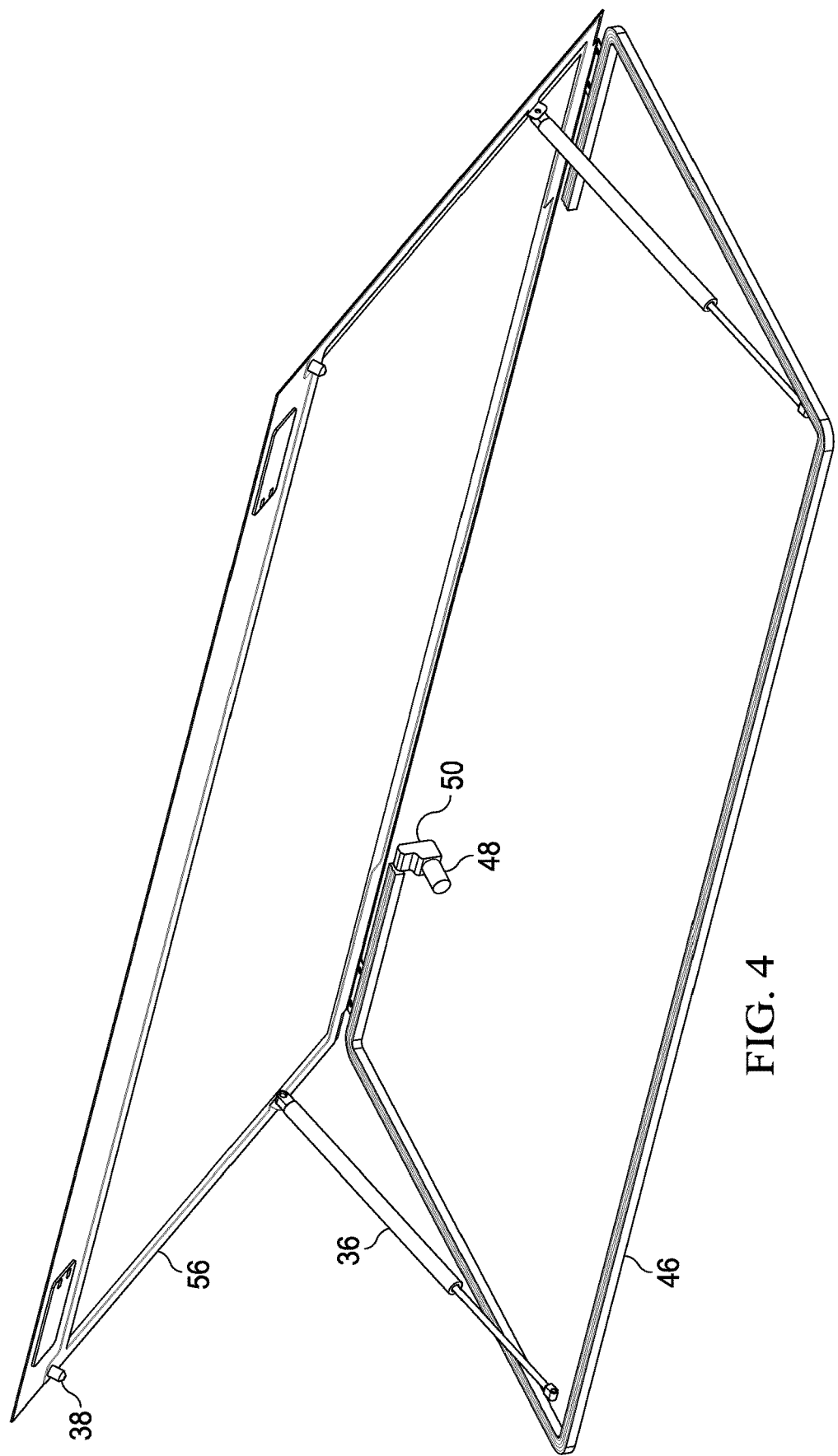
FIG. 4 depicts a side perspective view of the inflatable seal separate from the main housing portion and aligned to seal against a bottom surface of the secondary display.

Referring now to FIG. 4, a side perspective view depicts inflatable seal 46 separate from the main housing portion and aligned to seal against a bottom surface of secondary display 20. In the example embodiment, inflatable seal 46 interfaces with a pump motor 48 and pump valve 50 that cooperate to inflate and deflate the seal, such as based upon commands provided from an embedded controller or other processor. A striking surface 56 integrated in the bottom surface of secondary display 20 aligns with inflatable seal 46 so that hydraulic arm 36 lowers secondary display 20 against a defined sealing surface. In one example embodiment, inflatable seal 46 is deflated before release of the capacitance lock to raise secondary display 20 and inflated only after secondary display fully closes. This inflation and deflation management helps to reduce stresses of inflatable seal 46 from over expansion when not compressed by the closed secondary display.

Figure 5:
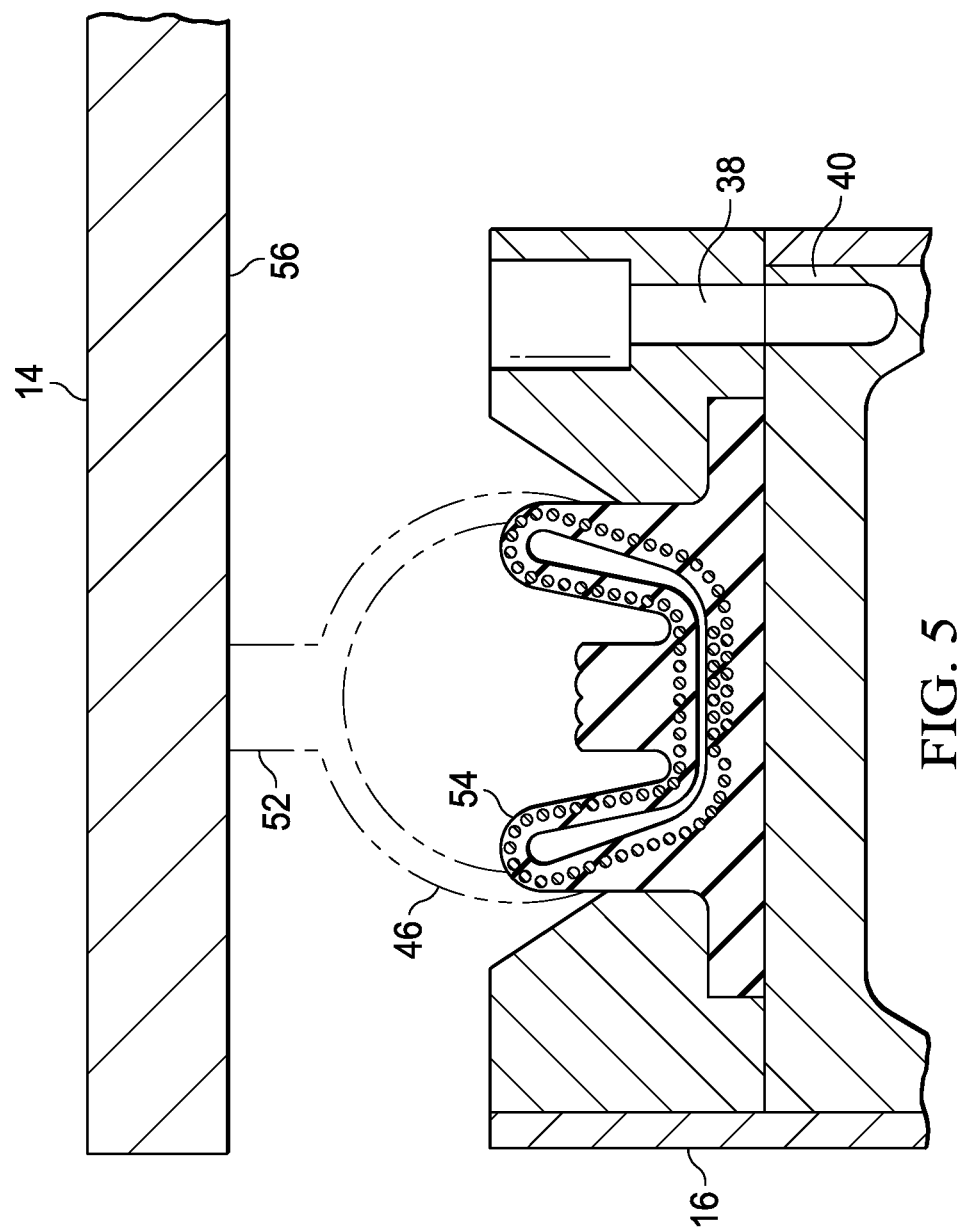
FIG. 5 depicts a cross sectional view of the inflatable seal pressing against the bottom surface of the secondary display.

Referring now to FIG. 5, a cross sectional view depicts inflatable seal 46 pressing against the bottom surface of the secondary display 20. In the example embodiment, outline 52 depicts the inflated positon of inflatable seal 46 and outline 54 depicts the deflated position. Main housing portion 16 defines a cavity in which inflatable seal 46 rests and having an upper side that protects the deflated outline 54 when exposed due to lifting of secondary display 20. The striking surface 56 provides a hard flat surface that inflatable seal 46 meets against when inflated so that an airtight seal is provided. Inflation of inflatable seal 46 presses upward against secondary display 20 to bias the closed position against movement while offering some buffer against unintended shocks or accelerations.

Figure 6:
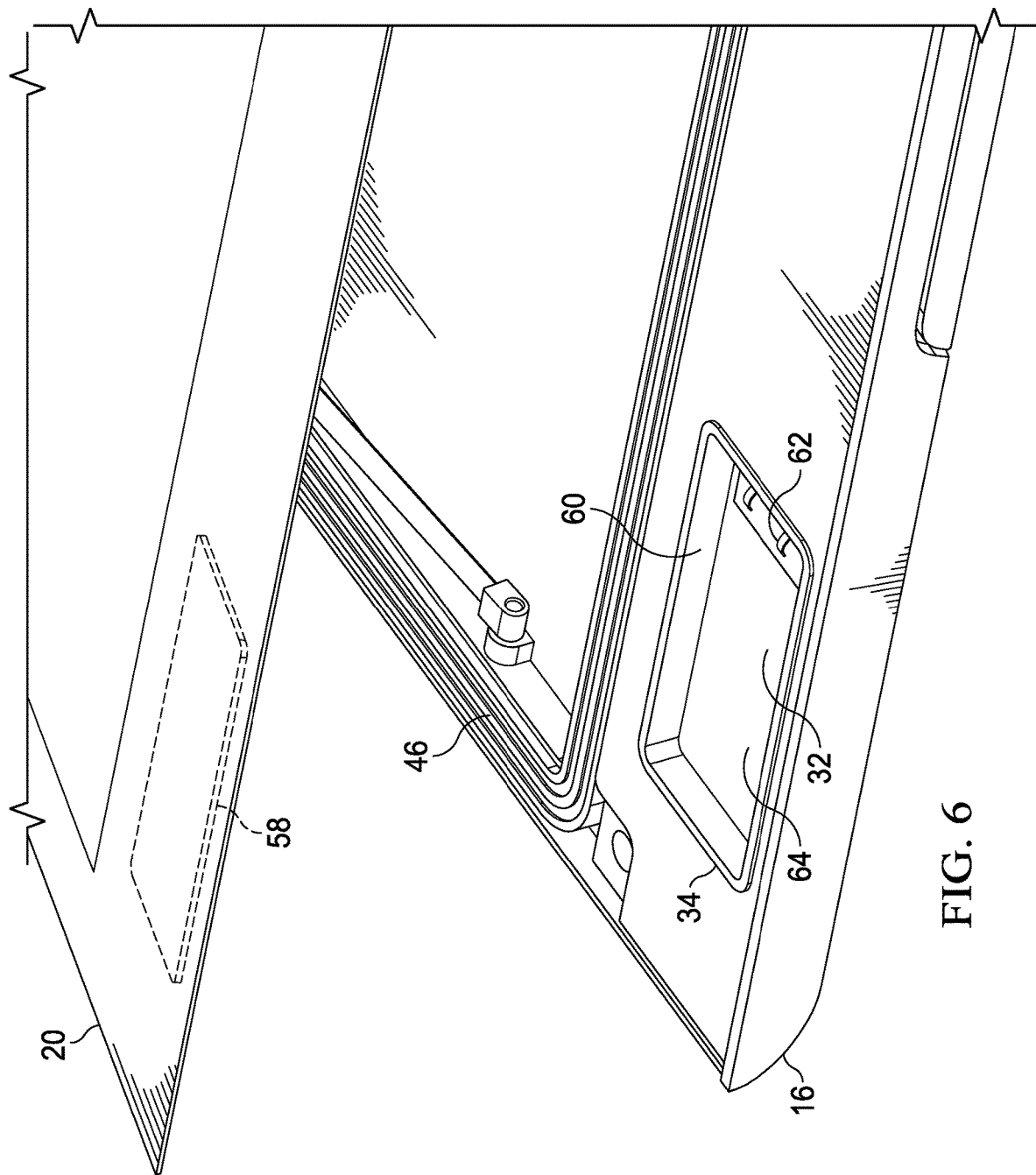
FIG. 6 depicts a side perspective view of a speaker disposed in a speaker cavity of the main housing portion.

Referring now to FIG. 6, a side perspective view depicts a speaker 32 disposed in a speaker cavity 34 of main housing portion 16. Secondary display 20 integrates wirelines and power pads 58 that communicate speaker signals and power from the processing components within main housing portion 16, such as an audio chipset, to speaker 32 contacts 62. For example, sound signals generated by a gaming application running on the system processor are communicated through secondary display 20 with integrated wirelines and from power pads 58 to spring contacts 62 integrated in speaker 32 and biased upwards and against the secondary display 20 with integrated springs. A dampener gasket 60 couples into speaker cavity 34 to seal the speaker chamber formed when secondary display 20 rotates down and over speaker 32. A backlight 64 is disposed in speaker cavity 34 to provide illumination as either a backlight for an integrated LCD or for other lighting effects.

Figure 7:
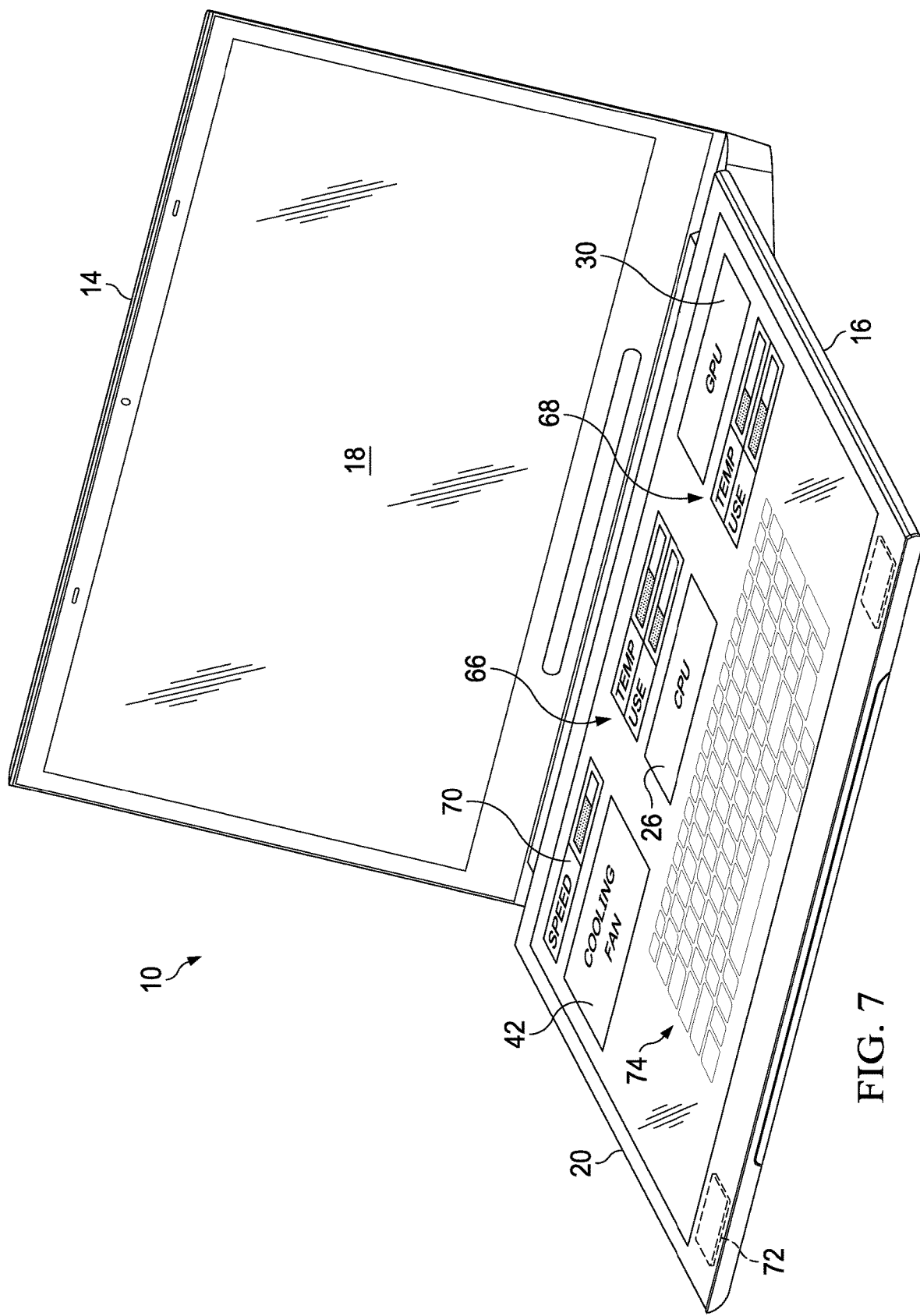
FIG. 7 depicts some examples of display visual images for presentation at a support display 20.

Referring now to FIG. 7, some examples of display visual images for presentation at support display 20 are depicted. In the example embodiment, support display 20 has a transparent composition that provides an end user with a view through a transparent cover and into the interior of the system housing to see internal processing components, such as CPU 26, GPU 30 and cooling fans 42. The transparent cover integrates a display that presents visual images relating to operating conditions of the processing components. In the example embodiment, CPU 26 has CPU operating condition indicators 66 that depict CPU temperature and usage as a percent of capacity. GPU 30 has GPU operating condition indicators 68 that depict GPU temperature and usage as a percent of capacity. Although the example places each component's operating conditions over top of the component, alternative embodiments may arrange the operating conditions by different priorities, such as placing components more prominently when close to operating limits. Cooling fan 42 and a cooling fan operating condition indicator 70 that indicates the cooling fan speed as a percent of maximum. In addition, a speaker illumination 72 is provided over speaker 32 to provide a visual effect associated with audio information. A virtual keyboard 74 is presented to accept typed key inputs detected by a capacitive touch surface integrated in secondary display 20. In one example embodiment having an LCD integrated in the transparent cover, the transparent view may be cutoff by blackening the LCD pixels. As is described below, secondary display 20 may also present content in coordination with main display 18, such as to support an application.

Figure 8:
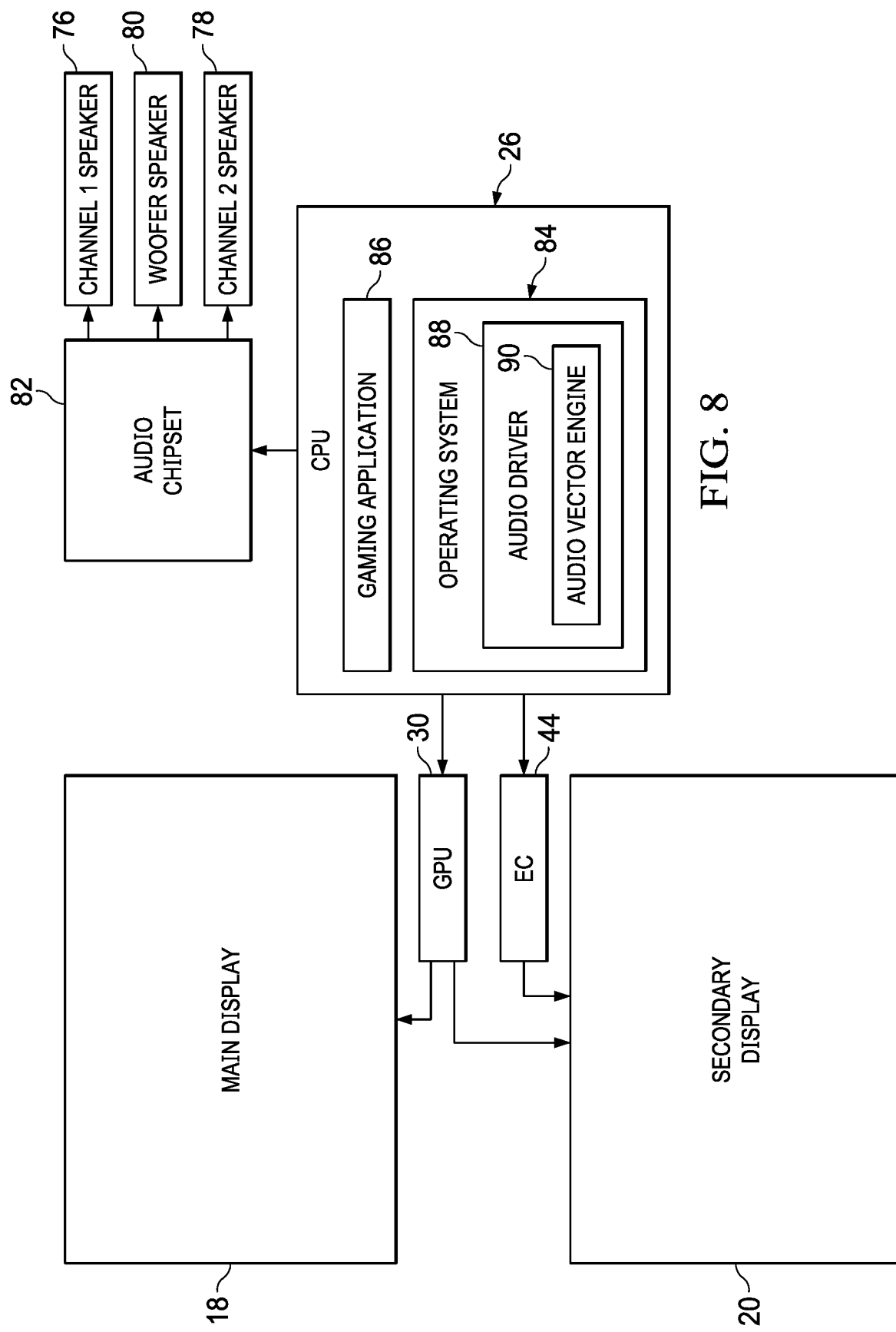
FIG. 8 depicts a block diagram of a system that leverages audio processing to supplement visual information presented to an end user, such as through a secondary display.

Referring now to FIG. 8, a block diagram depicts a system that leverages audio processing to supplement visual information presented to an end user, such as through a secondary display. In the example embodiment, CPU 26 executes a gaming application 86 over an operating system 84 that manages interactions between applications and hardware components. Operating system 84 has an audio driver 88 that plays sounds through an audio chipset at plural speakers. In the example embodiment, the plural speakers include a channel 1 speaker 76 for left stereo, a channel 2 speaker 78 for right stereo and a woofer speaker 80 that plays bass. In addition to coordinating playing of audio, operating system 84 manages presentation of visual images at main display 18 by having display pixel values generated by GPU 30 for scanning to main display 18. In addition, GPU 30 may generate pixel values for presentation as secondary display 20, such as in support of application 86 or to present operating conditions monitored by operating system 84. Embedded controller 44 or other similar processors may also manage presentation of visual images at secondary display 20, such as by using templates that present interfaces for operating conditions managed by embedded controller 44.

In order to enhance end user consumption of audio information, an audio vector engine 90 analyzes audio information played through audio chipset 82 and generates associated visual information for presentation at main display 18 or secondary display 20. In the example of a gaming application, audio vector engine 90 monitors the audio mix between plural audio channels and bass, and estimates an incoming direction and distance for shots fired in the game. Based upon the estimated origin of the shots fired, a visual indication is presented to the end user, such as by an arrow with a distance or by overlaying the position on a map of the game. In the shots fired example, audio vector engine 90 scans audio information generated by the application to detect patterns associated with a shot fired, such as a defined tone or pattern. For instance, a shot may be identified by a bass sound sent to a bass channel that has a rapid rise and fall. As another example, a shot may be identified by comparing sounds generated in stereo channels that show a defined pattern in different time frames. Once a shot fired sound is identified, comparing the pattern across plural stereo channels indicates a direction from which the sound originated. The specific analysis for determining a shot fired direction may vary based upon the number of audio channels and the type of stereo sound used. In some instances, such as where a shot fired relates to a slower weapon, like a mortar or bomb, additional calculations may be performed before impact of the weapon to predict the impact location. In both examples, a gamer obtains an advantage by knowing where shots originated and hence another player's location, and having warning of an impact to avoid the impact area of slower weapons. In the example gaming application, this analysis of audio output provides information to the end user that is not available directly from the game by extrapolating shots fired vector information from audio output. Similar estimations of sound location may be performed in alternative applications, such as by showing an estimate of positions from sounds generated by an audiovisual file, such as a movie. In the example embodiment, audio vector determination is performed as part of an audio driver of the operating system, however, in alternative embodiments, the audio vector determination may be performed by the audio chipset, the embedded controller, or specialized hardware like a DSP integrated circuit.

Figure 9:
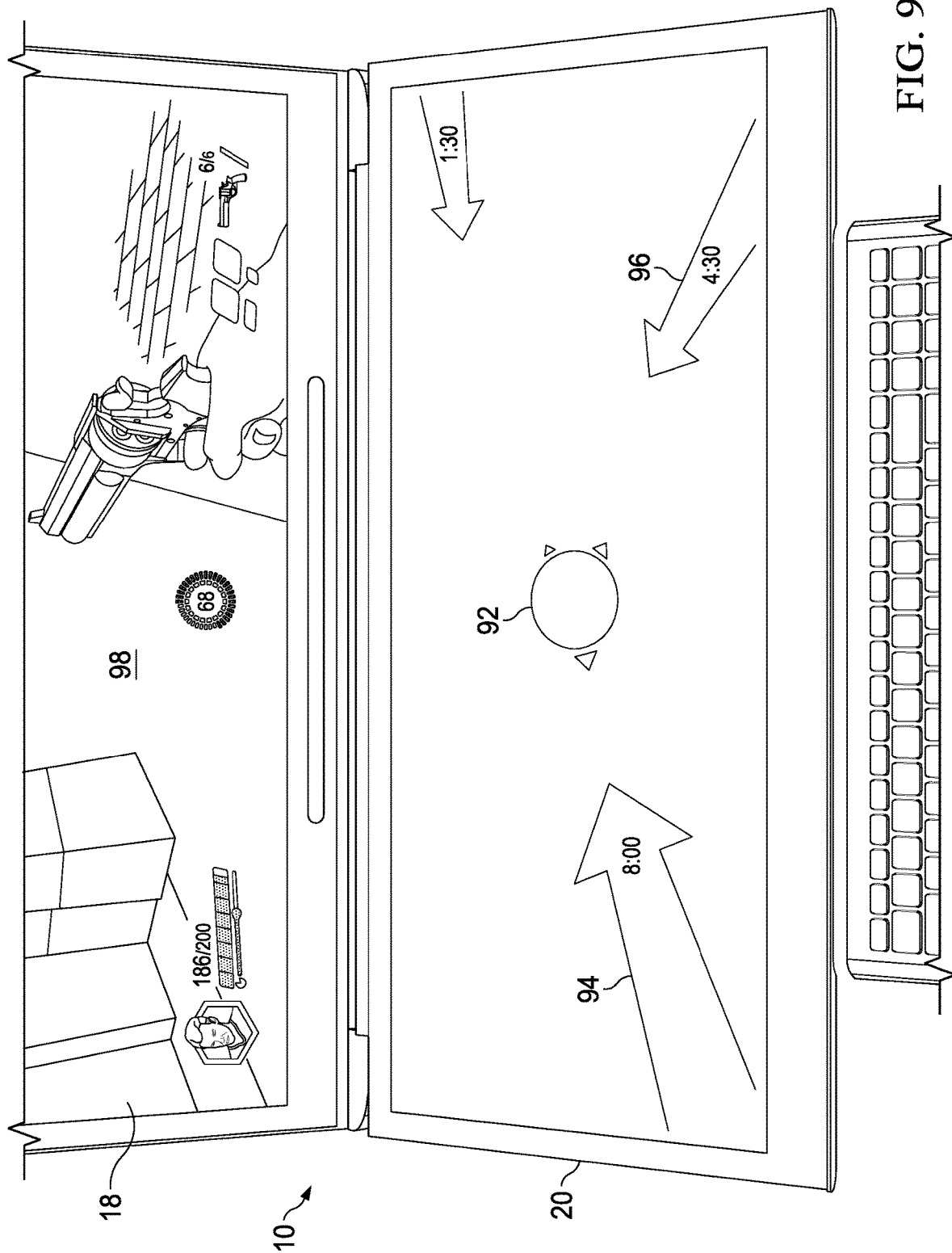
FIG. 9 depicts an example embodiment of audio-generated visual cues presented in coordination with application visual information.

Referring now to FIG. 9, an example embodiment depicts audio-generated visual cues presented in coordination with application visual information. In the example embodiment, secondary display 20 has a dark background with a central location 92 that indicates the end user's position in the game. On main display 18 the gaming application generates gaming visual images 98 for presentation to an end user, such as positional context of the end user in the game. The gaming application is coded to track other users relative to the end user, however, the positional information of the other users is generally hidden from the end user unless certain conditions are met, such as the end user looking in the direction of the other user. When a hidden player takes an action, such as a shot fired, the end user is provided in some cases with audio feedback of the action even though the other player's relative position remains hidden. Audio vector resolution from different audio channel outputs offers the end user an advantage by resolving the other player's position separate from the gaming application. On secondary display 20, a first audio position vector 94 depicts an arrow with a direction from which a first shot was fired and a distance estimate to the shot, such as based upon the volume of the audio. A second audio position vector 96 depicts a smaller arrow with a direction and distance to a second shot fired. The end user can view the secondary display while playing the game through application visual information at the main display in order to interact more effectively with the additional positional information that is not available from the gaming application itself.

Figure 10:
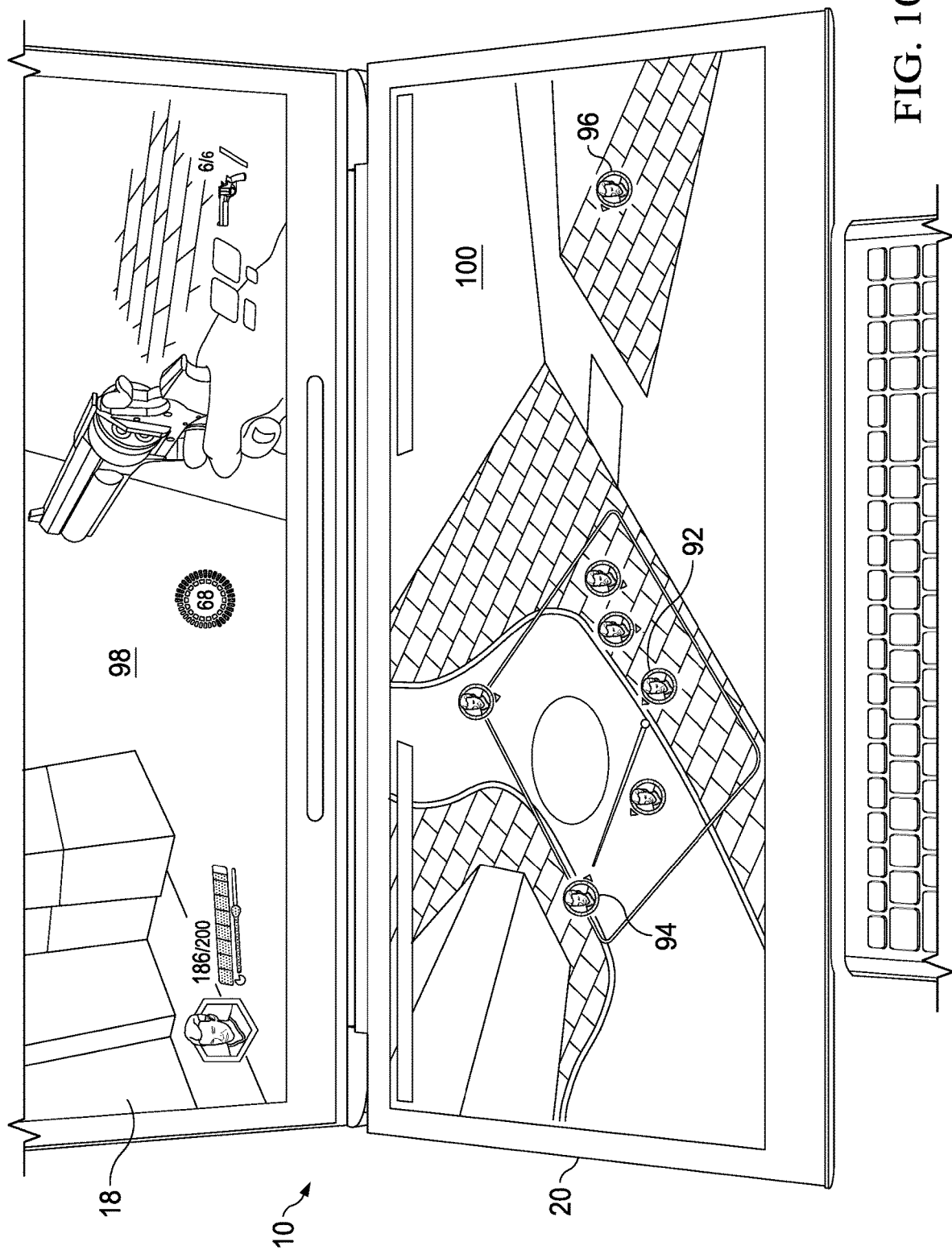
FIG. 10 depicts an alternative embodiment of audio generated visual cues presented on an application map.

Referring now to FIG. 10, an alternative embodiment depicts audio generated visual cues presented on an application map. The end user interacts with application visual information presented at main display 18 while tracking his relative position in the game using a map 100 presented on the secondary display. Audio-vector positions 94 and 96 are presented as before with direction and distance information, however, presenting the positions over the map provides the end user with improved situational awareness of the estimated player positions within the gaming context.

Figure 11:
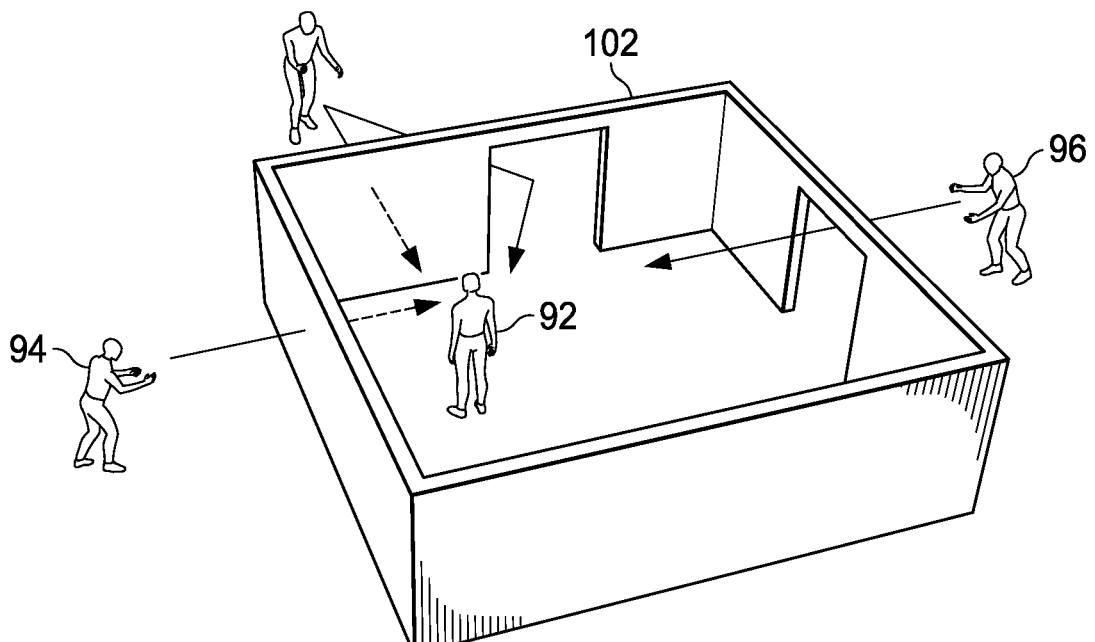
FIG. 11 depicts an example of audio vector resolution that determines an audio vector based in part on obstructions, occlusions and exclusions in a gaming application.
Figure 12:
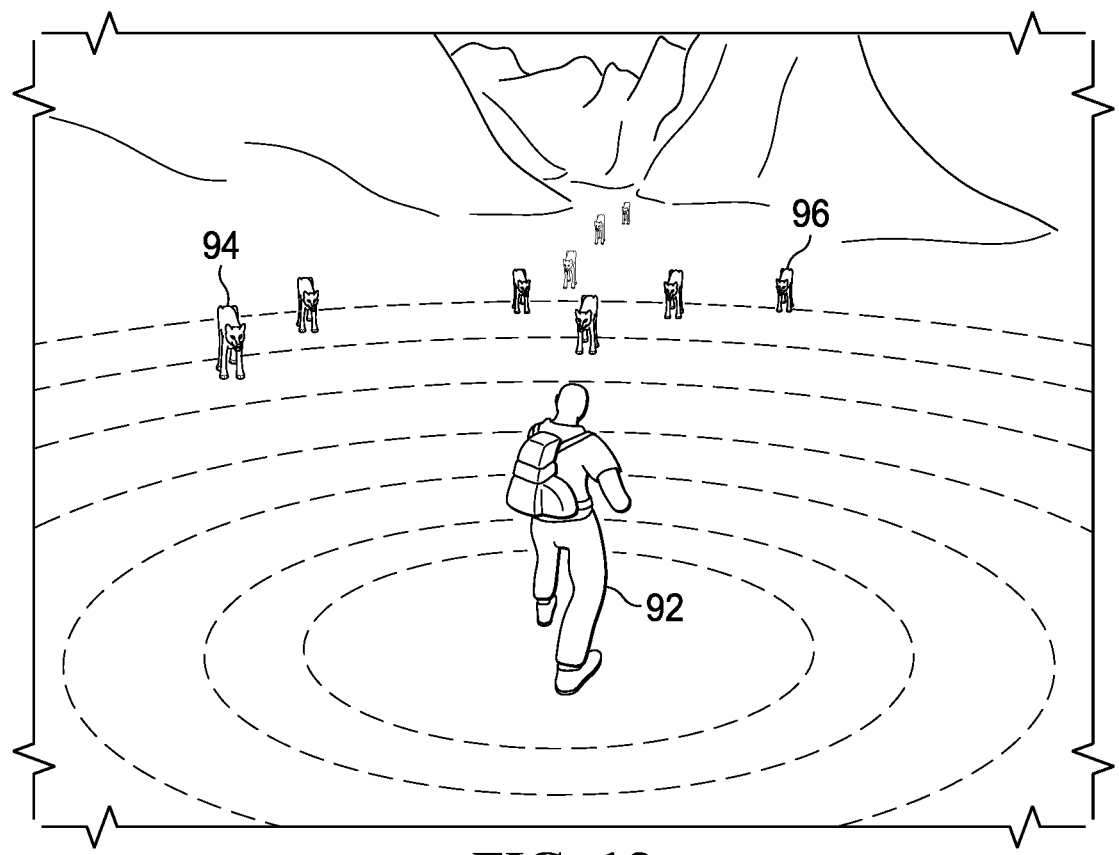
FIG. 12 depicts an example of an audio vector resolution that determines an audio vector based in part on volume estimated distances.

Referring now to FIG. 11, an example of audio vector resolution is depicted that determines an audio vector based in part on obstructions, occlusions and exclusions in a gaming application. By comparison, FIG. 12 depicts an example of an audio vector resolution that determines an audio vector based in part on volume estimated distances. Implementation of a particular audio vector resolution logic may depend upon the type of audio information available and the computational resources available at the system. In a multi-speaker system, such as 4.1 or 5.1, sound is distributed among speakers located around the end user's head so that the end user can distinguish a sound source based upon the speaker that plays the sound. In an open gaming area as depicted by FIG. 12, panning between the plural speakers to compare volumes provides an estimate from the end user position 92 to first and second audio position vectors 94 and 96 based upon the volume in each speaker for each sound source. The degree of precision depends upon the number of sound streams. For instance Dolby Digital uses 6 and 8 streams in the 5.1 and 7.1 configurations respectively so that vector and distance resolution to a sound source has a relatively high accuracy. Other types of audio systems, such as the Sensaura MultiDrive Creative Multispeaker Surround Sound (CMSS), reproduces sound using Head Related Transfer Functions (HRTF) so that every sound area includes its own crosstalk cancellation algorithm. Each type of audio generation will provide an end user with an audible indication of sound origination that is essentially reverse engineered from the audio output to determine a visual indication of the sound origin. In some instances, however, sound volume across channels may include other gaming factors that should be accounted for. As an example, FIG. 11 depicts an end user located in a room 102 so that shots fired or other audio associated with first and second audio position vectors 94 and 96 may vary based upon how sound passes through the room, such as with a door or window opening. In such situations, sounds reported by the audio system are adjusted to adapt to obstructions created in the game to provide a more accurate estimate of the other player's location. For instance, a room wall might decrease sound by 50% so that the source is 50% closer in the estimate. Different sized adjustments are applied for doors and varied further based upon an anticipated pathway followed by the sound.

Figure 13:
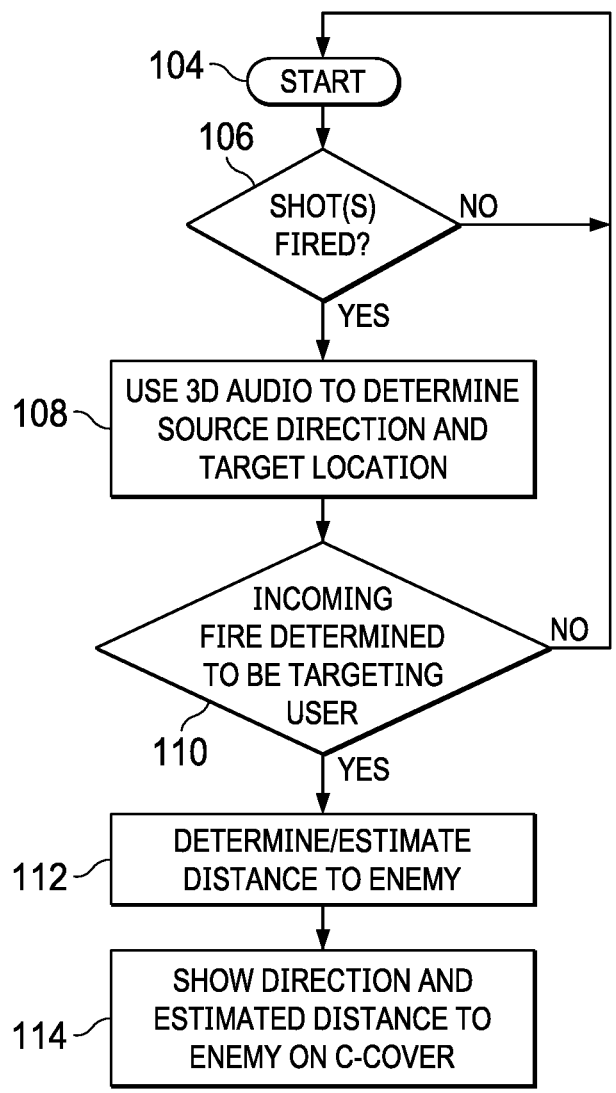
FIG. 13 depicts a flow diagram of a process for determining audio vector resolution to provide visual indications of audio source.

Referring now to FIG. 13, a flow diagram depicts a process for determining audio vector resolution to provide visual indications of audio sources. The process starts at step 104 and continues to step 106 to determine if a shot fired event as occurred, such as with a matching of audio output to a defined profile associated with the event or interest. In the shot fired example, the defined profile may be a tone, a sound rise and fall, or a pattern across multiple channels that matches a shot fired profile. If the defined profile is not identified, the process returns to step 104. Once the defined profile is determined, the process continues to step 108 to analyze the three dimensional audio associated with the audio event to determine a sound source vector with a direction and distance to the audible source. Once the sound origin and vector are determined, the process continues to step 110 to determine if the shot fired targets the end user by determining if the vector from the origin intersects the end user's game position. In the example embodiment, if the end user is not targeted, the process returns to step 104 to continue monitoring for audible events. In alternative embodiments, visual indications may be provided of non-targeting audible events. If at step 110 the shot fired is targeted at the end user, the process continues to step 112 to determine or estimate a distance to the source of the shot fired. The process then completes at step 114 by presenting a visual indication of the shot fired source on the secondary display.

Figure 14A:
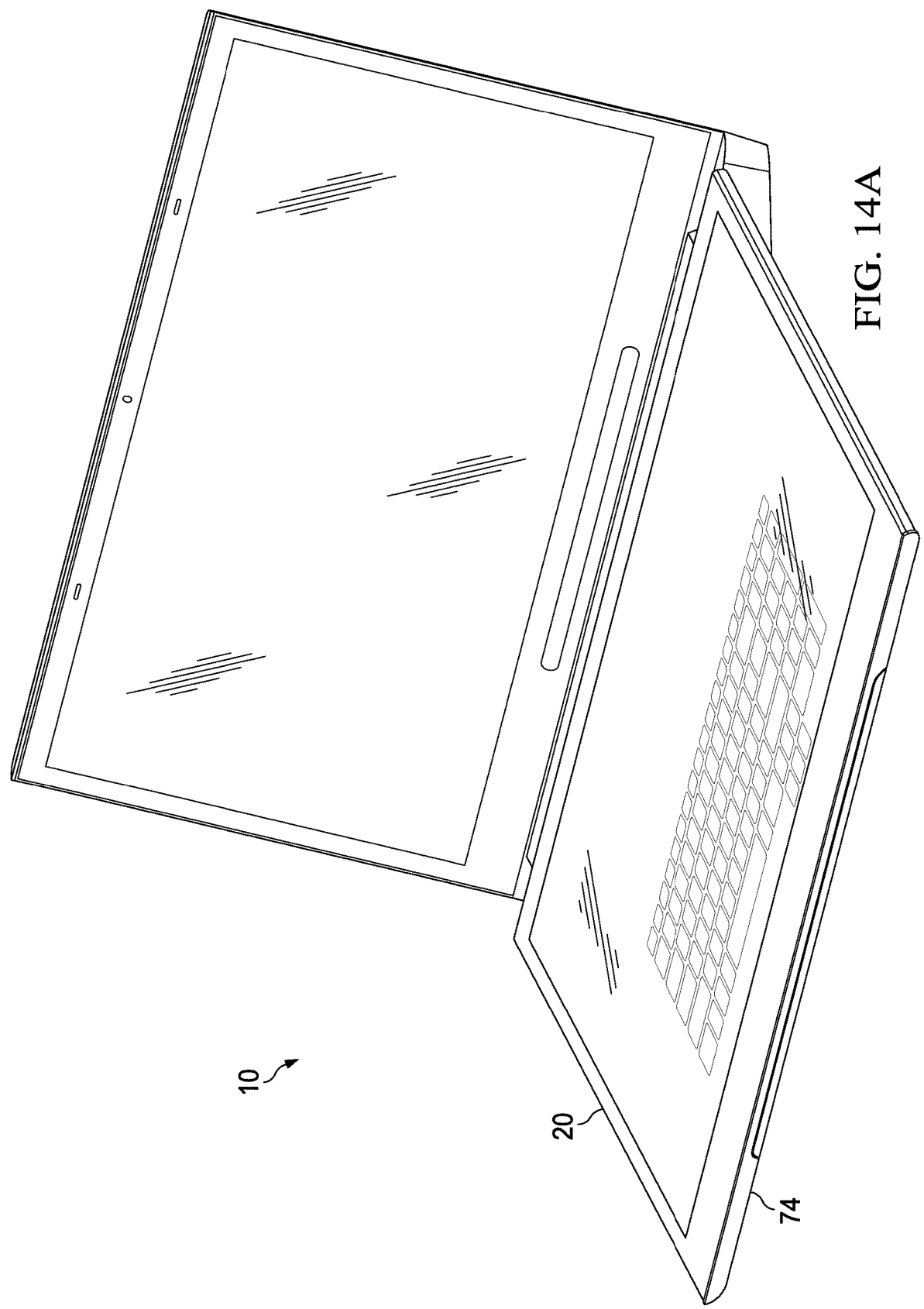
FIGS. 14A, 14B, and 14C depict a dynamic on-screen keyboard position presentation based upon a physical keyboard location during extension and retraction.
Figure 14B:
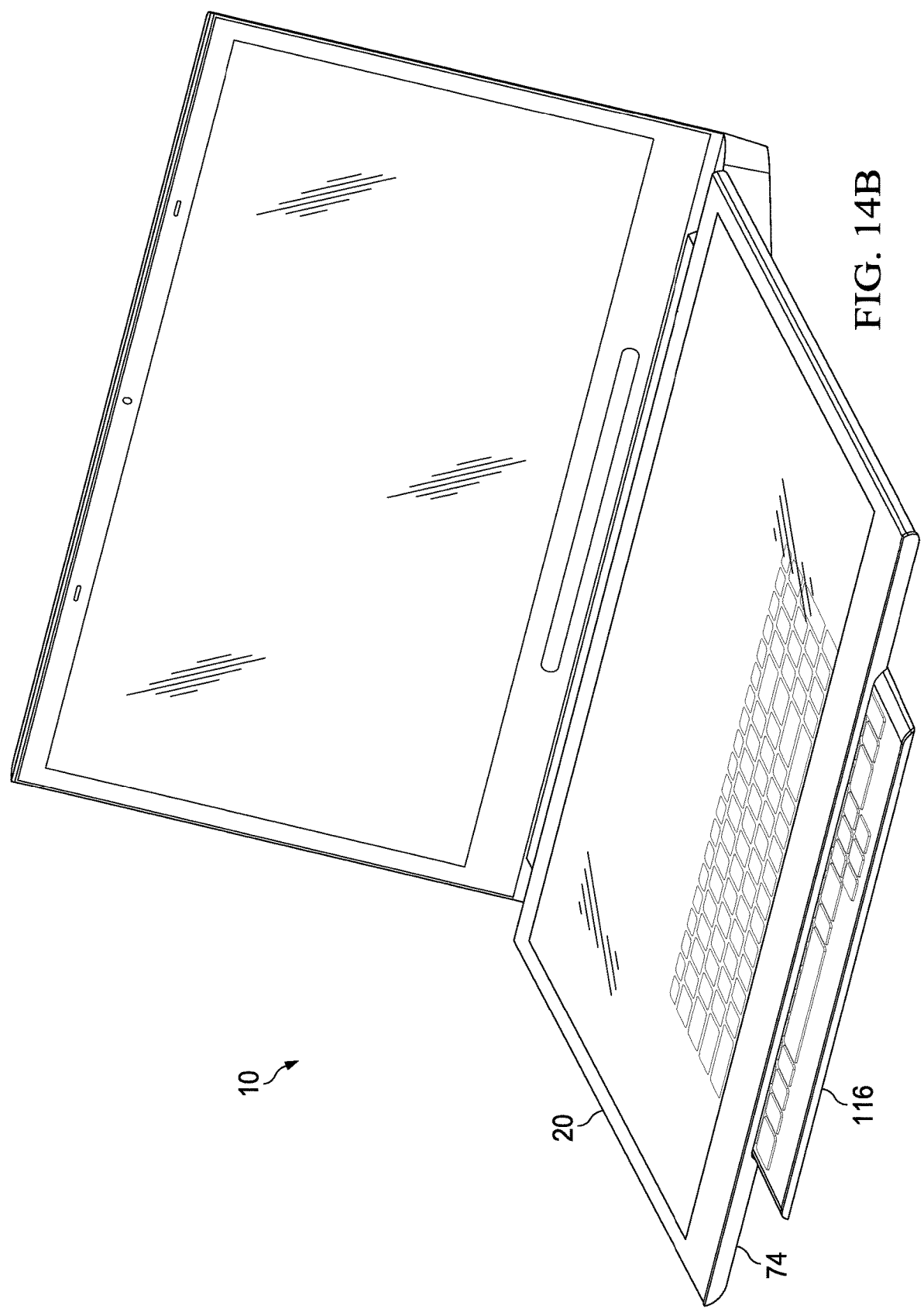
Figure 14C:
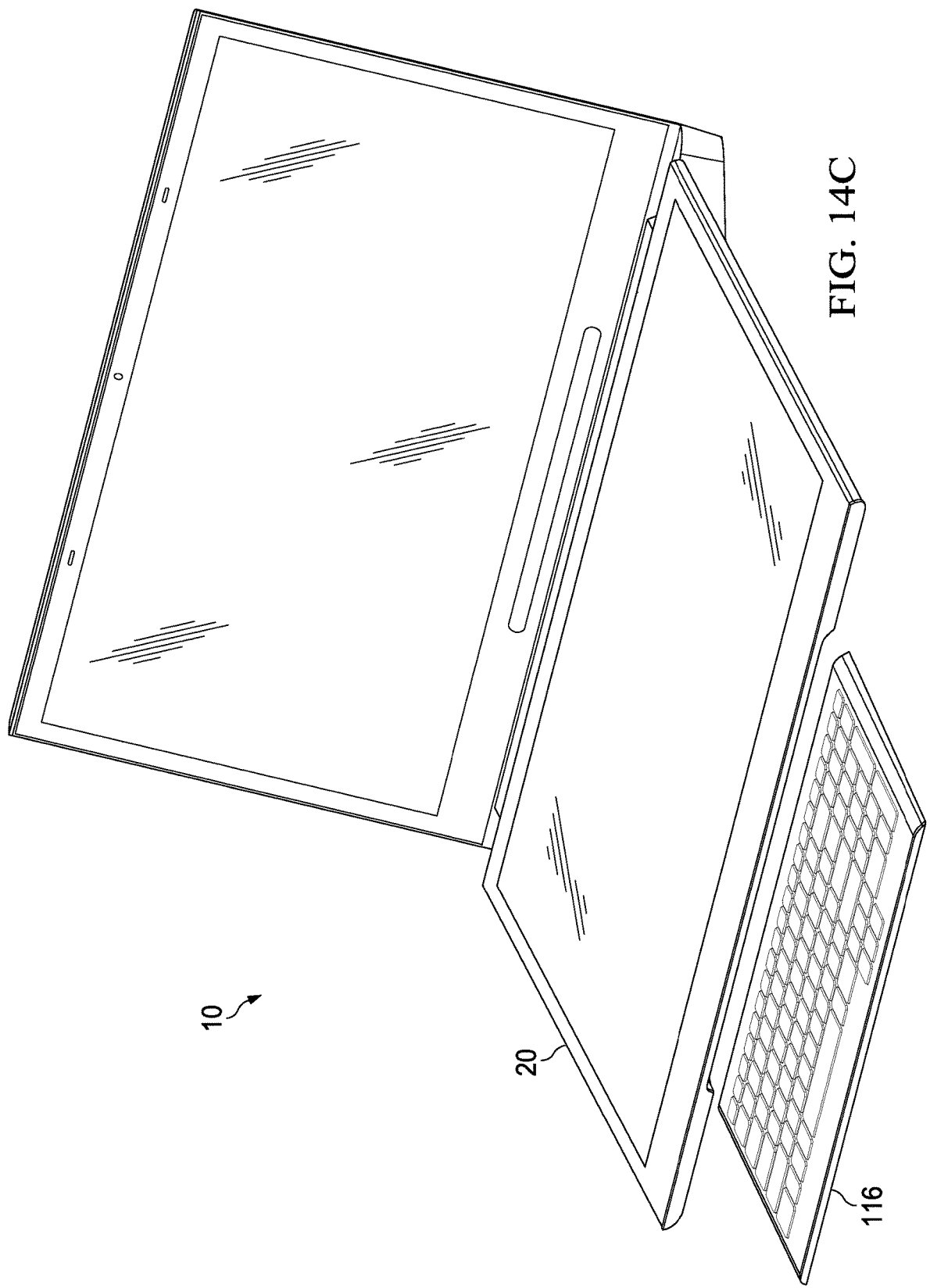

Referring now to FIGS. 14A, 14B, and 14C, a dynamic on-screen keyboard position presentation is depicted based upon a physical keyboard location during extension and retraction. FIG. 14A depicts information handling system 10 having an extendable keyboard in a retracted position and presenting a virtual keyboard at secondary display 20. An end user has access to virtual keyboard 74 to type inputs at the presented keys that are interpreted based upon touch detection of the inputs by a capacitive touch detection surface. FIG. 14B depicts a partial extension of a physical keyboard 116 from within information handling system 10 towards an extended position at which the end user can type inputs. Physical keyboard 116 may extend manually, such as by an end user grasp and pull, or through an automated mechanism, such as step motor, magnetic attraction or other forces. Further, physical keyboard extension may provide a separation of the keyboard from the housing for use as a separate peripheral device, such as through a wireless interface. The position of physical keyboard 116 may be sensed by a variety of different sensors, such as the position of a motor used to perform the extension or Hall sensors and magnets disposed opposite each other between the system housing and keyboard. As physical keyboard 116 extends from information handling system 10 virtual keyboard 74 slides in its presentation at secondary display 20 so that keys not visible on physical keyboard 116 due to its position within information handling system 10 are visible at virtual keyboard 74. Advantageously, an end user can interact with either the partially extended physical keyboard 116 by pressing exposed keys, or with the partially presented virtual keyboard, which shows only those keys not available at the physical keyboard. FIG. 14C depicts complete extension of physical keyboard 116 at which point virtual keyboard 74 is no longer presented. When physical keyboard 116 is returned into information handling system 10, virtual keyboard 74 is again presented so that, as keys of physical keyboard 116 are hidden within information handling system 10, those keys are presented at secondary display 20. The end user is provided with a sliding virtual keyboard 74 that tracks the position of physical keyboard 116 when hidden within information handling system 10. The sliding virtual keyboard 74 is generated by an operating system, BIOS or firmware of an embedded controller.

Figure 15:
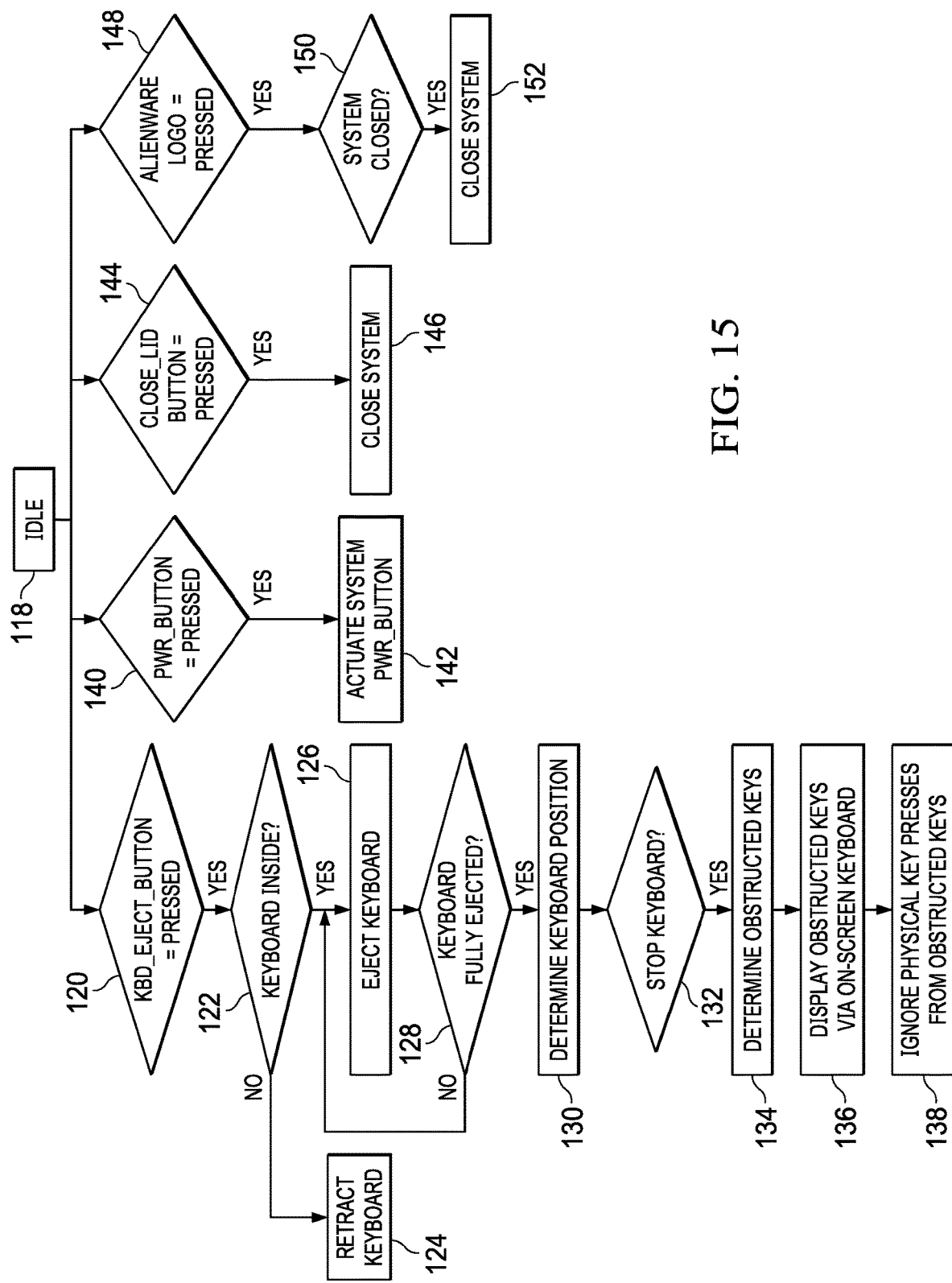
FIG. 15 depicts a flow diagram of a process for dynamic on-screen keyboard presentation based upon a physical keyboard location.

Referring now to FIG. 15, a flow diagram depicts a process for dynamic on-screen keyboard presentation based upon a physical keyboard location. The process starts in an idle state at step 118 to initiate logic based upon detection of an end user interaction. At step 120, an end user press of a keyboard rejection button continues to step 122 to determine if the keyboard is retracted or extended. If the keyboard is extended, the process continues to step 124 to retract the keyboard with the virtual keyboard presented in a synchronized manner as the keyboard is hidden within the system housing. If at step 122 the keyboard is within the system, the process continues to step 126 to initiate ejection of the keyboard, such as by activation of a motor, solenoid, electromagnet or other actuator device. The ejection progress is monitored through completion at step 128 and 126 while the process continues at step 130 to determine the keyboard position during the extension. The keyboard position at step 130 is monitored at step 132 through full keyboard ejection while the process continues to step 134. At step 134 a determination is made of the keys of the physical keyboard that are obstructed by the system housing, such as by comparing the keyboard position within the housing against a map of keyboard positions. At step 136, obstructed keys of the physical keyboard are displayed via the virtual keyboard presented at the secondary display. At step 138, during the extension physical key presses detected at the physical keyboard are ignored for the keys that are obstructed within the system housing. Similarly, presses at virtual keyboard keys are accepted as system inputs.

From the idle state at step 118, if a power button press at step 140 is detected to power up or down the system, the process continues to step 142 to perform a default action in response to a power button actuation. For instance, pressing the power button to turn off the system can initiate retraction of the keyboard while pressing the power button with the system off can optionally result in a default action, such as extending the keyboard. If from the idle state at step 118 a close lid button is detected at step 144 to command closing of the lid housing portion by the motorized hinge, the process continues to step 146 to close the housing. A command to close the housing may optionally command retraction of the keyboard. If at the idle state of step 118 and logo press is detected at step 148, a determination is made at step 150 whether the housing is closed and, if so, the process continues to step 152 to open the housing. In each instance where the housing rotates between open and closed states, an end user may set desired default keyboard retraction and extension parameters and present a coordinated movement of the virtual keyboard and the physical keyboard during retraction and extension.

Although the present invention has been described in detail, it should be understood that various changes, substitutions and alterations can be made hereto without departing from the spirit and scope of the invention as defined by the appended claims.

What is claimed is:

1. A portable information handling system comprising:
   a housing having first and second portions rotationally coupled by a hinge;
   a processor disposed in the housing and operable to execute instructions that process information;
   a memory disposed in the housing and interfaced with the processor, the memory operable to store the instructions and information;
   a display disposed in the first housing portion and interfaced with the processor, the display operable to present the information as visual images;
   a transparent cover sized to fit on the second housing portion over the processing components, the transparent cover integrating a display layer;
   plural speakers disposed in the housing and interfaced with the processor to present the information as audible sounds based upon plural surround sound channels; and
   an audio vector engine interfaced with the processor and operable to detect predetermined sound information associated with the surround sound channels and in response to present visual cues associated with the sound information at the transparent cover display layer.

2. The portable information handling system of claim 1 wherein:
   the instructions comprise a gaming application and the information comprises a shot fired; and
   the audio vector engine detects a vector of the shots fired based upon the surround sound channels and presents the visual cue at a location of the transparent cover display layer relative to the plural speakers from which the shot fired originated.

3. The portable information handling system of claim 2 wherein:
   the instructions comprise a volume associated with the shot fired; and
   the audio vector engine presents the visual cue at the location based at least in part upon the volume.

4. The portable information handling system of claim 3 wherein:
   the instructions include obstructions disposed along the vector; and
   the audio vector engine adjusts the location determined by the volume based upon the obstructions.

5. The portable information handling system of claim 4 wherein:
   the instructions comprise a gaming map that presents on the transparent cover display layer; and
   the audio vector engine presents the shot fired over the gaming map at a location estimated to correlate with the gaming map.

6. The portable information handling system of claim 3 wherein the processor monitors operating conditions including processor temperature and utilization and the transparent cover display layer presents the processor operating conditions when a shot fired is not detected.

7. The portable information handling system of claim 3 further comprising:
   one or more cooling fans operable to generate a cooling airflow in the housing;
   wherein the transparent cover display layer presents the cooling fan speed.

8. The portable information handling system of claim 3 further comprising:
   a graphics processor unit interfaced with the processor and operable to process the information for presentation as visual images, the graphics processor unit monitoring a thermal state; and
   wherein the transparent cover display layer presents the graphics processor unit thermal state.

9. The portable information handling system of claim 3 further comprising:
   a keyboard that selectively retracts into and extends out of the second housing portion;
   wherein the transparent cover display presents a virtual keyboard if the keyboard retracts.

10. A method for presenting audiovisual information at a portable information handling system, the method comprising:
    executing a gaming application on a processor of the portable information handling system;

presenting visual images from visual information generated by the executing the gaming application;

presenting a shot fired audible sound by plural speakers of the portable information handling system based upon audio information generated by execution of the gaming application;

comparing the audio information with a predetermined profile to detect a direction of the shot fired;

presenting a visual cue of the direction of the shot fired based upon the comparing; comparing the audio information with the predetermined profile to detect a distance of the shot fired;

presenting the visual cue of the distance of the shot fired based upon the comparing;

analyzing the visual information to determine an obstruction in the direction of the shot fired; and adjusting the distance of the shot fired based upon the obstruction.

11. The method of claim 10 further comprising:
presenting the visual images from the visual information at a first display integrated in a first housing portion of the portable information handling system; and
presenting the visual cue at a transparent cover coupled to a second housing portion of the portable information handling system, the transparent cover having a display layer to present the visual cue.

12. The method of claim 11 wherein the display layer comprises a liquid crystal display, processing components disposed in the second housing portion visible through the transparent cover.

13. The method of claim 11 further comprising:
presenting a map of the game at the transparent cover; and
presenting the visual cue on the map at the relative position at which the shots fired originated.

14. The method of claim 11 further comprising:
tracking a thermal state of the processor; and
presenting the thermal state at the transparent cover over top of a location of the processor in the second housing portion.

* * * * *